United States Patent
Willmeroth et al.

(10) Patent No.: US 8,952,478 B2
(45) Date of Patent: Feb. 10, 2015

(54) RADIATION CONVERSION DEVICE AND METHOD OF MANUFACTURING A RADIATION CONVERSION DEVICE

(71) Applicant: Infineon Technologies Austria AG, Villach (AT)

(72) Inventors: Armin Willmeroth, Augsburg (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/869,121

(22) Filed: Apr. 24, 2013

(65) Prior Publication Data

US 2014/0319641 A1 Oct. 30, 2014

(51) Int. Cl.
*H01L 31/102* (2006.01)
*H01L 21/36* (2006.01)
*H01L 31/0352* (2006.01)
*H01L 31/18* (2006.01)

(52) U.S. Cl.
CPC ...... *H01L 31/03529* (2013.01); *H01L 31/1864* (2013.01)
USPC .......................................... 257/463; 438/481

(58) Field of Classification Search
CPC ................. H01L 31/02008; H01L 31/022433; H01L 31/0352; H01L 31/03529; H01L 31/1864
USPC ........ 257/414, 431, 461, 463; 438/48, 57, 73, 438/481, 542, 558
See application file for complete search history.

(56) References Cited

U.S. PATENT DOCUMENTS

| | | | |
|---|---|---|---|
| 6,444,897 B1 * | 9/2002 | Luque-Lopez et al. | 136/255 |
| 6,489,190 B2 * | 12/2002 | Disney | 438/188 |
| 6,566,595 B2 * | 5/2003 | Suzuki | 136/255 |
| 7,612,344 B1 | 11/2009 | Schulze et al. | |
| 2005/0017176 A1 * | 1/2005 | Koch et al. | 250/338.4 |
| 2006/0266998 A1 * | 11/2006 | Vega et al. | 257/21 |
| 2011/0143475 A1 * | 6/2011 | Fuertes Marron et al. | 438/47 |
| 2013/0092221 A1 * | 4/2013 | De Moura Dias Mendes et al. | 136/255 |

* cited by examiner

*Primary Examiner* — Nikolay Yushin
(74) *Attorney, Agent, or Firm* — Murphy, Bilak & Homiller, PLLC

(57) ABSTRACT

A radiation conversion device such as a photovoltaic cell, a photodiode or a semiconductor radiation detection device, includes a semiconductor portion with first compensation zones of a first conductivity type and a base portion that separates the first compensation zones from each other. The first compensations zones are arranged in pillar structures. Each pillar structure includes spatially separated first compensation zones and extends in a vertical direction with respect to a main surface of the semiconductor portion. Between neighboring ones of the pillar structures the base portion includes second compensation zones of a second conductivity type, which is complementary to the first conductivity type. The radiation conversion device combines high radiation hardness with cost effective manufacturing.

21 Claims, 16 Drawing Sheets

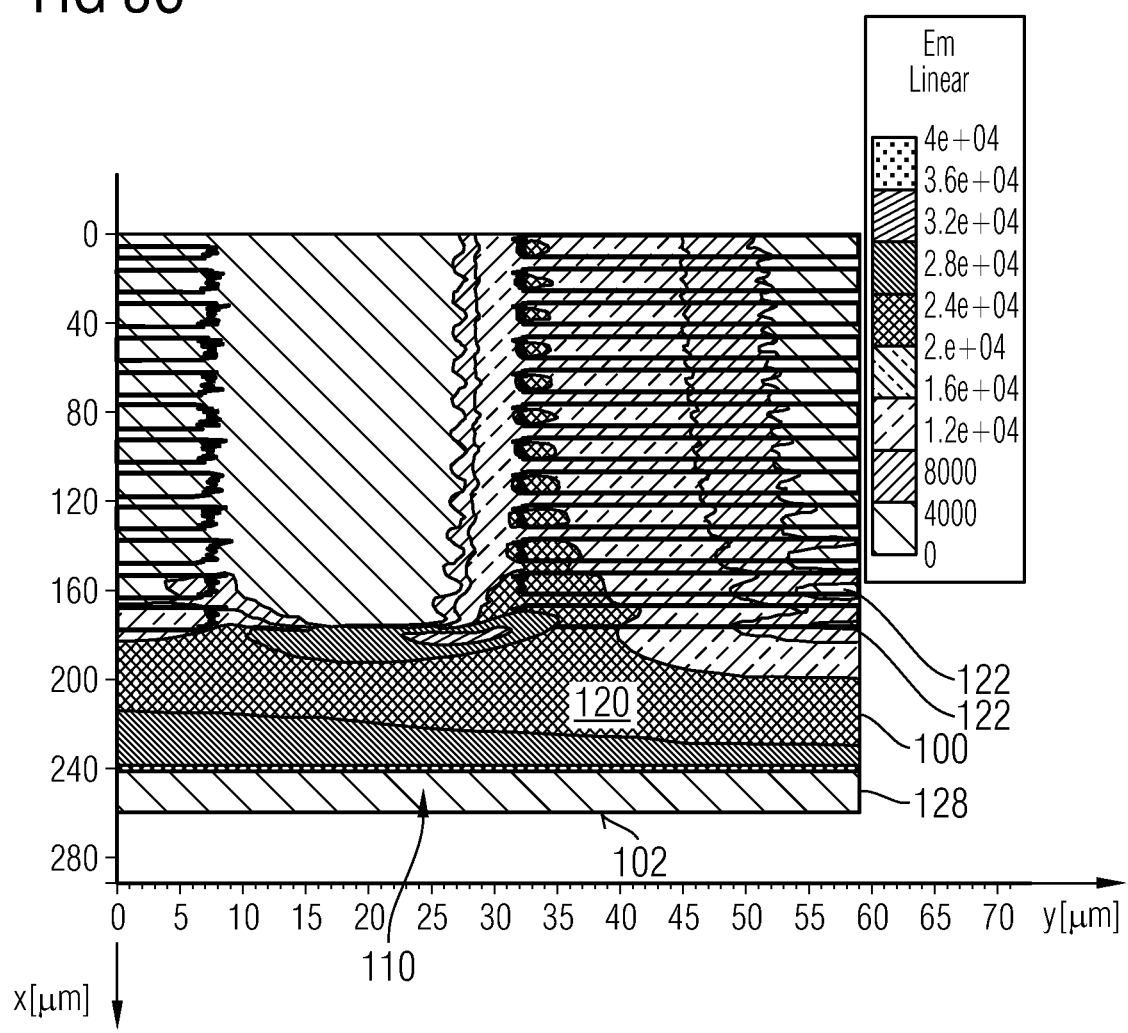

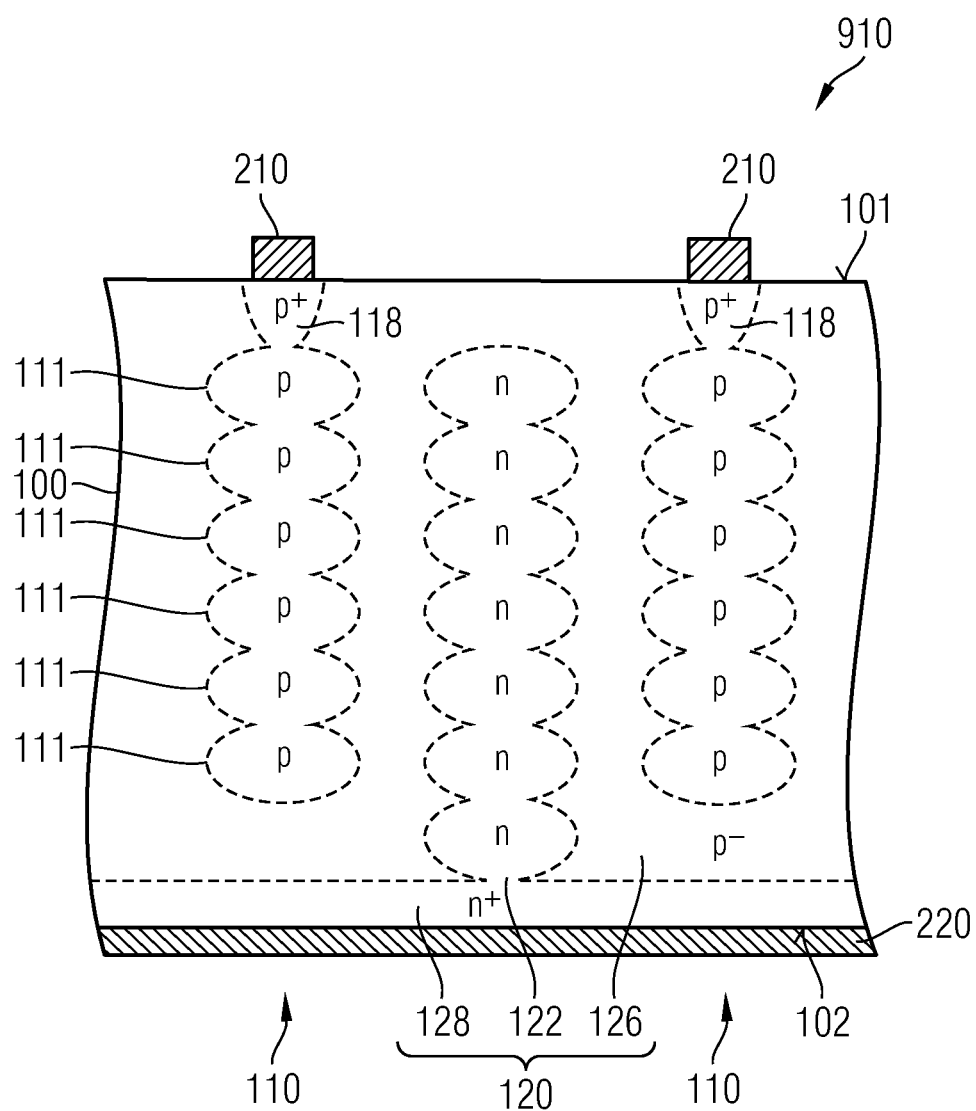

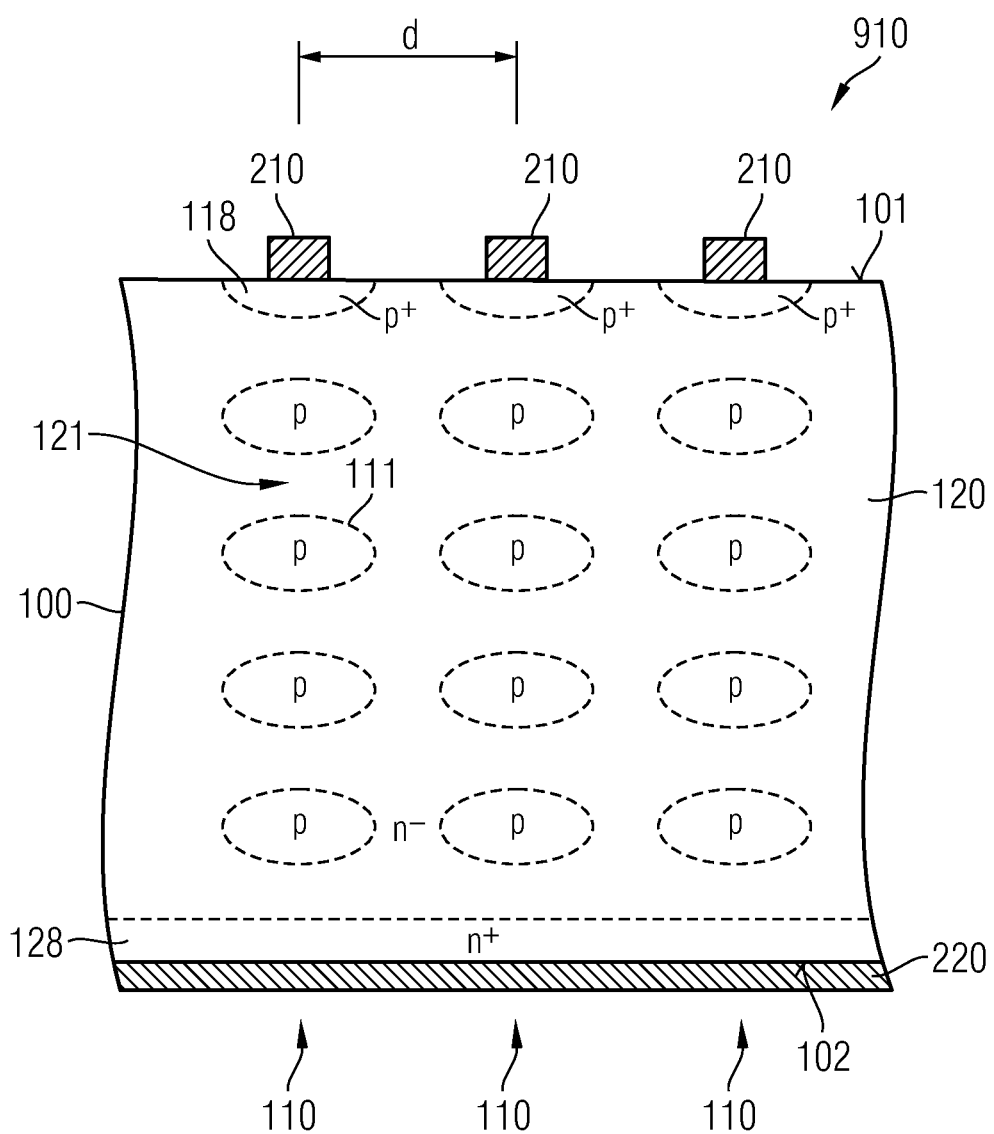

RADIATION CONVERSION DEVICE AND METHOD OF MANUFACTURING A RADIATION CONVERSION DEVICE

BACKGROUND

In semiconductor conversion devices incoming radiation generates electron-hole pairs by transferring electrons from a valence band to a conduction band. The generated electron-hole pairs are separated according to their polarity and travel to the respective electrodes where they induce an electric current. The radiation conversion mechanism may be used in semiconductor radiation detectors, photovoltaic cells and photo-detectors. It is desirable to provide improved radiation conversion devices.

SUMMARY

According to an embodiment a radiation conversion device includes a semiconductor portion with first compensation zones of a first conductivity type and a base portion that separates the first compensation zones from each other. The first compensations zones are arranged in pillar structures, wherein each pillar structure includes at least two of the first compensation zones and extends in a vertical direction with respect to a main surface of the semiconductor portion. Between neighboring ones of the pillar structures the base portion includes second compensation zones of a second conductivity type, which is complementary to the first conductivity type.

A radiation conversion device according to another embodiment includes a semiconductor portion with first compensation zones of a first conductivity type arranged in stripe-shaped pillar structures and second compensation zones of a second, complementary conductivity type between neighboring pillar structures. Each pillar structure includes at least two of the first compensation zones and extends in a vertical direction and in a first lateral direction with respect to a main surface of the semiconductor portion. A first electrode structure with a plurality of strips directly adjoins the semiconductor portion. Each strip is assigned to at least two of the pillar structures.

A radiation conversion device according to a further embodiment includes a semiconductor portion with first compensation zones of a first conductivity type and a base portion. The first compensation zones are arranged in pillar structures, wherein each pillar structure extends in a vertical direction with respect to a main surface of the semiconductor portion. The base portion includes a background portion and second compensation zones of a second, complementary conductivity type between neighboring ones of the pillar structures. The second compensation zones form further pillar structures extending in the vertical direction. Vertical impurity profiles of the second compensation zones are Gaussian distributions.

According to a further embodiment, a method of manufacturing a radiation conversion device includes growing by epitaxy a sequence of semiconductor layers on a semiconductor substrate. In at least two of the semiconductor layers impurities of a first conductivity type are introduced into exposed first sections of a process surface of a preceding one of the semiconductor layers before growing a subsequent one of the semiconductor layers on the preceding one. The semiconductor layers are annealed to form first compensation zones from the introduced impurities. The annealing is terminated before the first compensation zones get structurally connected.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3C is a schematic diagram showing electric field profiles in the radiation conversion device of FIG. 3A in the reverse biased mode.

FIG. 4B is a schematic cross-sectional view of a portion of a radiation conversion device in accordance with an embodiment providing connected implanted compensation zones of both impurity types.

FIG. 7C is a schematic cross-sectional view of the semiconductor substrate of FIG. 7B after annealing.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration, which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
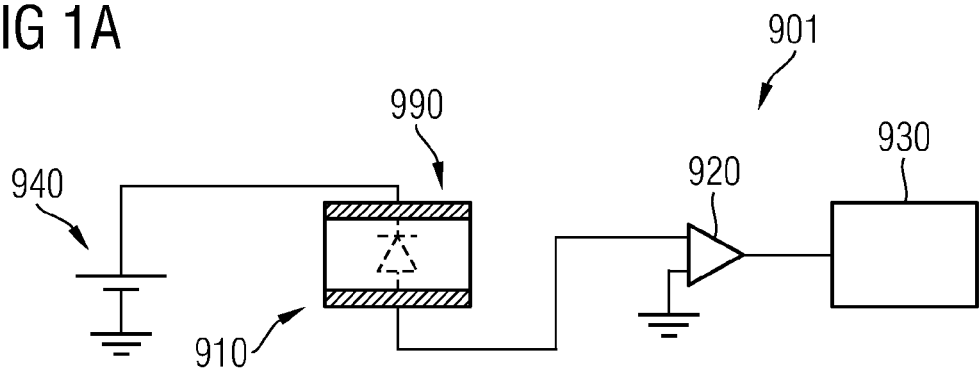
FIG. 1A is a simplified block diagram of a radiation detector device according to an embodiment.

FIG. 1A shows a radiation meter 901 based on a semiconductor radiation conversion device 910 configured as a radiation detection device. The radiation conversion device 910 may be a reverse biased semiconductor diode operated in the non-conducting mode. A DC source 940 and an amplifier circuit 920 may be electrically coupled to electrodes of the radiation conversion device 910. An evaluation unit 930 may be electrically coupled to an output terminal of the amplifier circuit 920.

The DC source 940 reverse biases the radiation conversion device 910 and generates a depletion zone in the radiation conversion device 910. Incoming radiation 990 incidents on a radiation-receiving surface of the radiation conversion device 910. The incoming radiation 990 may be ionizing radiation, for example gamma radiation, beta radiation or X-ray radiation, or non-ionizing radiation, e.g. ultra violet light, visible light or infrared light and generates electron-hole pairs. In the depletion zone the generated electrons and holes migrate to the corresponding electrodes and induce current pulses between the electrodes. The amplifier circuit 920 may amplify the induced current and the evaluation unit 930 may further process and analyze the amplified current.

The sensitivity of the radiation conversion device 910 may be increased by a cooling device reducing the intrinsic charge carrier density and/or by applying a comparably high voltage between the electrodes such that the accelerated electrons trigger the generation of further electron-hole pairs. Each of the electrodes may be partitioned and evaluated differently to obtain local information regarding the incoming radiation.

Figure 1B:
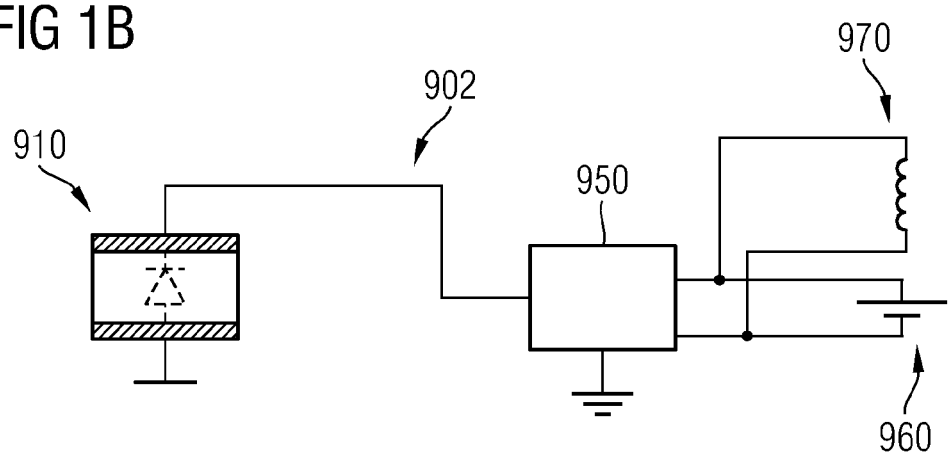
FIG. 1B is a simplified block diagram of a solar generator device according to another embodiment.

FIG. 1B refers to a solar generator device 902 using a radiation conversion device 910 configured as a photovoltaic cell. The output current of the radiation conversion device 910 may be fed to a charge controller 950 controlling the charging of a buffer battery 960 or supplying current to a load 970, e.g. a DC-to-AC converter.

Figure 1C:
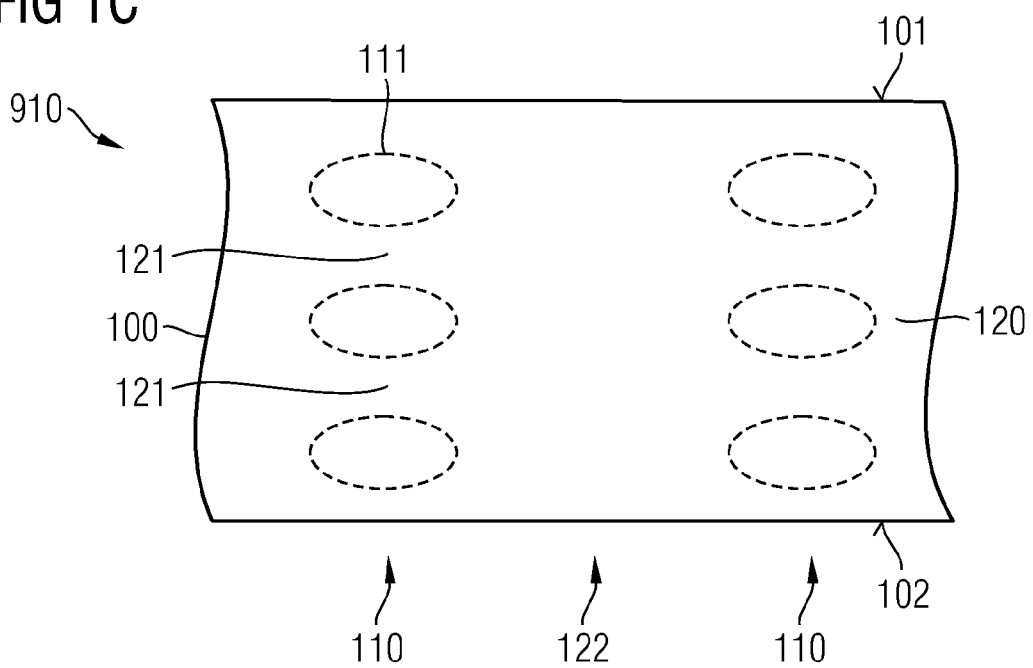
FIG. 1C is a schematic cross-sectional view of a portion of a radiation conversion device in accordance with an embodiment.

FIG. 1C refers to a radiation conversion device 910 which may be configured as a photovoltaic cell, a photodiode or as a radiation detection device. The radiation conversion device 910 includes a semiconductor portion 100 provided from a single-crystalline semiconductor material. According to an embodiment, the semiconductor material is a silicon crystal Si, a germanium crystal Ge, or a silicon-germanium crystal SiGe. According to other embodiments, the single-crystalline semiconductor material may be gallium nitride GaN or gallium arsenide GaAs, by way of example.

The semiconductor portion 100 has a main surface 101 and a rear side surface 102 which may be in substance parallel to the main surface 101. A thickness between the main surface 101 and the rear side surface 102 may be between 50 μm and several millimeters. A silicon-based radiation detection device may have a thickness of at least 150 and at most 400 μm, for example about approximately 250 μm. The shape of the semiconductor portion 100 may be a rectangle with an edge length in the range of several millimeters or a circle with a diameter of several millimeters. The normal to the main surface 101 defines a vertical direction and directions orthogonal to the normal direction are lateral directions.

The semiconductor portion 100 includes first compensation zones 111 of a first conductivity type which are arranged in pillar structures 110. Each pillar structure 110 extends in the vertical direction and includes at least two first compensation zones 111. Some or all of the first compensation zones 111 of a pillar structure 110 are spatially separated from each other.

A base portion 120 separates the first compensation zones 111 from each other. The base portion 120 includes second compensation zones 122 of a second conductivity type, which is complementary to the first conductivity type. The second compensation zones 122 are formed between neighboring pillar structures 110. The base portion 120 further includes sections 121 separating the first compensation zones 111 in the vertical direction.

The sections 121 may have the second conductivity type which is opposite to the conductivity type of the first compensation zones 111. For example, the base portion 120 including the sections 121 and the second compensation zones 122 may have a uniform background impurity concentration. According to other embodiments, the sections 121 of the base portion 120 have the same conductivity type as the first compensation zones 111, but distinguish from the first compensation zones 111 significantly as regards the impurity concentration and the vertical impurity profile.

For example, the sections 121 of the base portion 120 separating the first compensation zones 111 in the vertical direction may have a mean net impurity concentration such that they are fully depleted in the operation mode, for example by applying a reverse bias voltage of at least 10 V. The mean net impurity concentration in the first compensation zones 111 is at least twenty times, or even at least forty times the mean net impurity concentration in the sections 121 of the base portion 120.

The vertical impurity profiles of the sections 121 of the base portion 120 may differ significantly from the vertical impurity profile in the first compensation zones 111. For example, the vertical impurity profiles of the first compensation zones 111 may approximate Gaussian distributions, whereas the impurity distribution in the sections 121 is approximately uniform.

When the radiation conversion device 910 is reverse-biased, the electric field applied between the first and second compensation zones 111, 122 depletes a predominant part of the semiconductor portion 100 even at a background impurity concentration in the base portion 120 which is high compared with an intrinsic layer of a PIN diode. The increased background impurity concentration increases device ruggedness in view of radiation damages gradually shifting the net impurity concentration to higher acceptor concentrations such that only a smaller portion of an original detection volume can be depleted. Where conventional radiation conversion devices based on PIN diodes gradually become less sensitive because the depleted portion shrinks, the long-term influence of the radiation on the sensitivity of radiation detection devices and the efficiency of photovoltaic cells based on the compensation zones 111 is low.

Compared to approaches using pillar structures 110 with connected compensation zones, significantly less epitaxial layers and/or shorter anneal times for diffusing implanted impurities are required. The manufacture of the radiation conversion device 910 is significantly simplified and more cost effective.

In FIGS. 2A to 2D a semiconductor portion 100 of a radiation conversion device 910 has a main surface 101, which may be the radiation-receiving surface, and a rear side surface 102 parallel to the main surface 101. The semiconductor portion 100 may have a rectangular or circular shape. Pillar structures 110 extend in the vertical direction between the main surface 101 and the rear side surface 102. The pillar structures 110 may be column-like or strip-like. According to an embodiment, a cross-section of the pillar structures 110 parallel to the main surface 101 is a circle, an oval, an ellipse or a rectangle, for example a square with rounded corners. According to the illustrated embodiment, the pillar structures 110 are stripe-shaped and have a length in a first lateral direction parallel to the main surface 101 that is significantly greater than a width in a second lateral direction orthogonal to the first lateral direction.

Each pillar structure 110 includes two or more first compensation zones 111 which are spatially separated from each other. The first compensation zones 111 have the first conductivity type and are embedded in a base portion 120. Sections of the base portion 120 between neighboring pillar structures 110 provide second compensation zones 122 of a second conductivity type, which is the opposite of the first conductivity type. Further sections 121 of the base portion 120 separate the first compensation zones 111 along the vertical direction.

The impurities in the first compensation zone 111 compensate for the impurities in the second compensation zones 122 such that by applying a sufficiently high reverse voltage the regions between neighboring pillar structures 110 can be completely depleted. The resulting depletion zones represent the detection volume where the incoming radiation generates free charge carriers and where the free charge carriers are transported to the respective electrodes.

The required operation reverse voltage (detection voltage) depends on the impurity concentrations in and the dimensions of the first and second compensation zones 111, 122.

According to an embodiment, the dopant charge of the first conductivity type in the first compensation zones 111 is higher than the dopant charge of the second conductivity type in the second compensation zones 122. In a plane parallel to the first surface 101 and cutting the first compensation zones 111 the number of impurity atoms of the first conductivity type exceeds the number of impurity atoms of the second conductivity type.

A typical detector voltage, which is typically between 5% and 95% of the breakdown voltage, fully depletes the second compensation zones 122 but does not fully deplete the first compensation zones 111. The detector voltage and the lateral dimension of the first compensation zones 111 may be matched such that a lateral width of a remaining non-depleted portion of the first compensation zones 111 is less than a charge carrier diffusion length prevailing in the first compensation zones 111. The width of this non-depleted portion may be, for example, less than 50% of the diffusion length or less than 10% of the diffusion length. In this way a recombination of free charge carriers generated by radiation within the first compensation zones 111 is minimized and the detection sensitivity maximized.

For example, a ratio between a mean net dopant concentration in the first compensation zones 111 and a mean net dopant concentration in the second compensation zones 122 may be between 2 and $10^5$, wherein according to an embodiment the impurity concentration in the base portion 120 is at least $1.5 \times 10^{13}$ cm$^{-3}$ or even $5 \times 10^{13}$ cm$^{-3}$ for Si, at least $2.5 \times 10^{14}$ cm$^{-3}$ for Ge and at most $1.5 \times 10^{17}$ cm$^{-3}$ for Si and at most $2.5 \times 10^{17}$ cm$^{-3}$ for Ge. The pillar structures 110 may be equally spaced. For a silicon device, a pitch d between the centers of neighboring pillar structures 110 may be between 10 μm and 200 μm, for example between 20 μm and 160 μm.

A first electrode structure 210 is arranged in direct contact with the main surface 101 and directly adjoins the semiconductor portion 100. The first electrode structure 210 may be a contiguous, uniform layer covering a closed section of the main surface 101. According to other embodiments, the first electrode structure 210 includes a plurality of strips, wherein each strip is assigned to one or more pillar structures 110 such that the respective strip provides to the assigned pillar structures 110 a potential applied to the first electrode structure 210 when the detection voltage is applied.

According to the illustrated embodiment each single strip is assigned to one single pillar structure 110. According to other embodiments, each single one of the strips is assigned to at least two of the pillar structures 110. According to further embodiments, the strips run in a second lateral direction which intersects the first lateral direction. For example, the second lateral direction is orthogonal to the first lateral direction.

Heavily doped first contact zones 118 of the first conductivity type are provided in sections of the semiconductor portion 100 directly adjoining the first electrode structure 210 to provide a low-ohmic contact (Schottky contact) between the first electrode structure 210 and the semiconductor portion 100. For example, for p type silicon (p-Si) the impurity concentration in the first contact zones 118 may be at least $10^{16}$ cm$^{-3}$ and for n type silicon (n-Si) at least $3 \times 10^{19}$ cm$^{-3}$.

The first contact zones 118 may be aligned to the pillar structures 110. For example, each contact zone 118 may be completely arranged in the vertical projection of one of the pillar structures 110. According to another embodiment, some or all of the contact zones 118 overlap only partially with the vertical projection of one, two or more pillar structures 110. The first contact zones 118 may be spaced from or may overlap with the closest first compensations zones 111.

The semiconductor portion 100 includes one or more second contact zone(s) 128 of the second conductivity type directly adjoining the rear side surface 102. The second contact zone(s) 128 provide ohmic contacts to a second electrode structure 220. The second electrode structure 220 may cover a closed area of the rear side surface 102. According to other embodiments, the second electrode structure 220 may include strips, wherein each strip partially or completely overlaps with the vertical projection of at least one second compensation zone 122.

Each of the first and second electrode structures 210, 220 may include one or more layers, wherein each layer may include aluminum Al, copper Cu or an aluminum copper alloy, e.g. AlCu or AlSiCu. According to other embodiments, at least one of the first and second electrode structures 210, 220 is provided from a transparent conductive material, for example a tin oxide. At least one of the first and second electrode structures 210, 220 may include one or more layers containing, as main constituent(s), nickel Ni, gold Au, silver Ag, titanium Ti, tantalum Ta or Palladium Pd.

The base portion 120, which includes the second compensation zones 122 and the sections 121 separating the first compensation zones 111 in the vertical direction, has an approximately uniform impurity distribution. Vertical impurity profiles of the first compensation zones 111 are approximately Gaussian distributions. According to the illustrated embodiment, the first conductivity type is p-type and the second conductivity type is n-type.

Figure 2A:
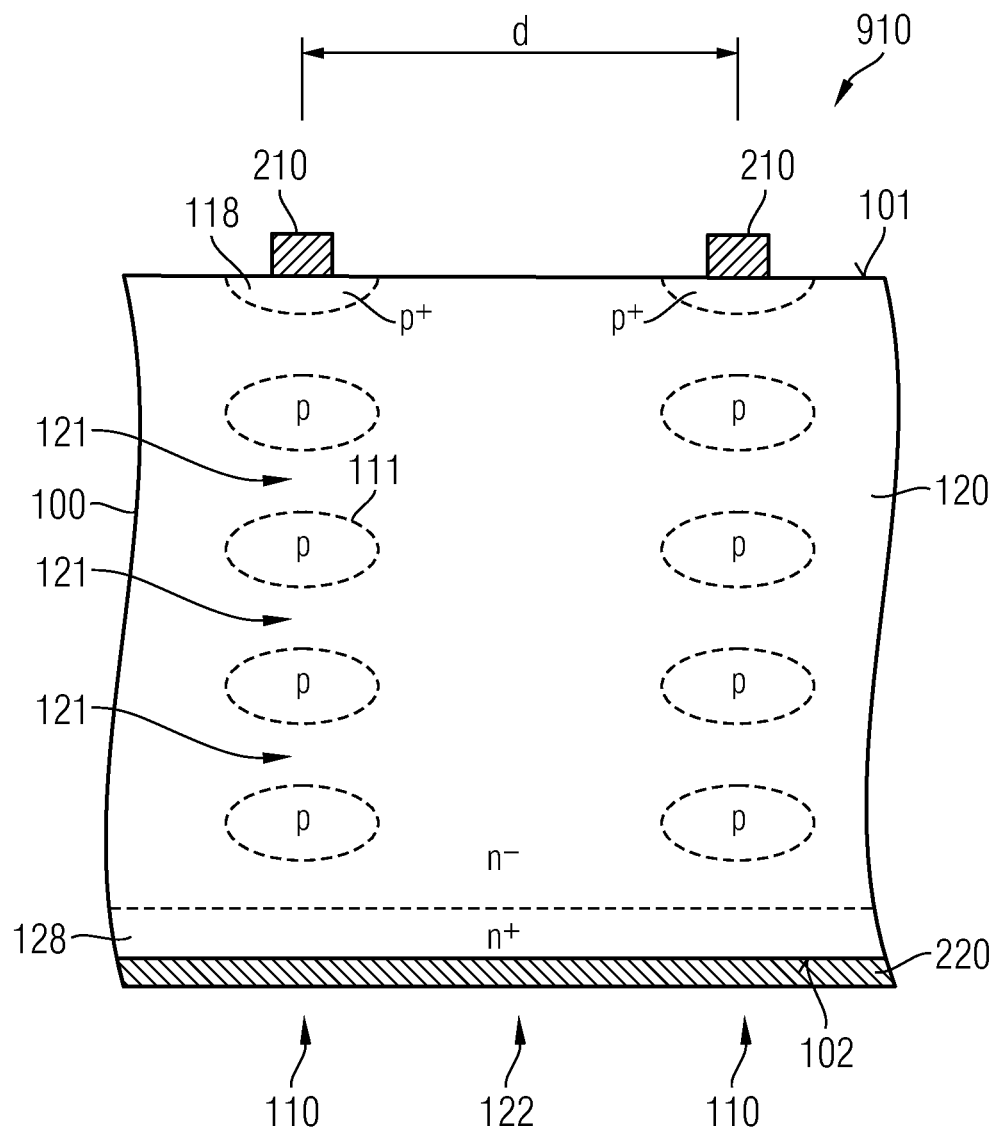
FIG. 2A is a schematic cross-sectional view of a portion of a radiation conversion device in accordance with an embodiment providing a uniformly n-doped base portion.
Figure 2B:
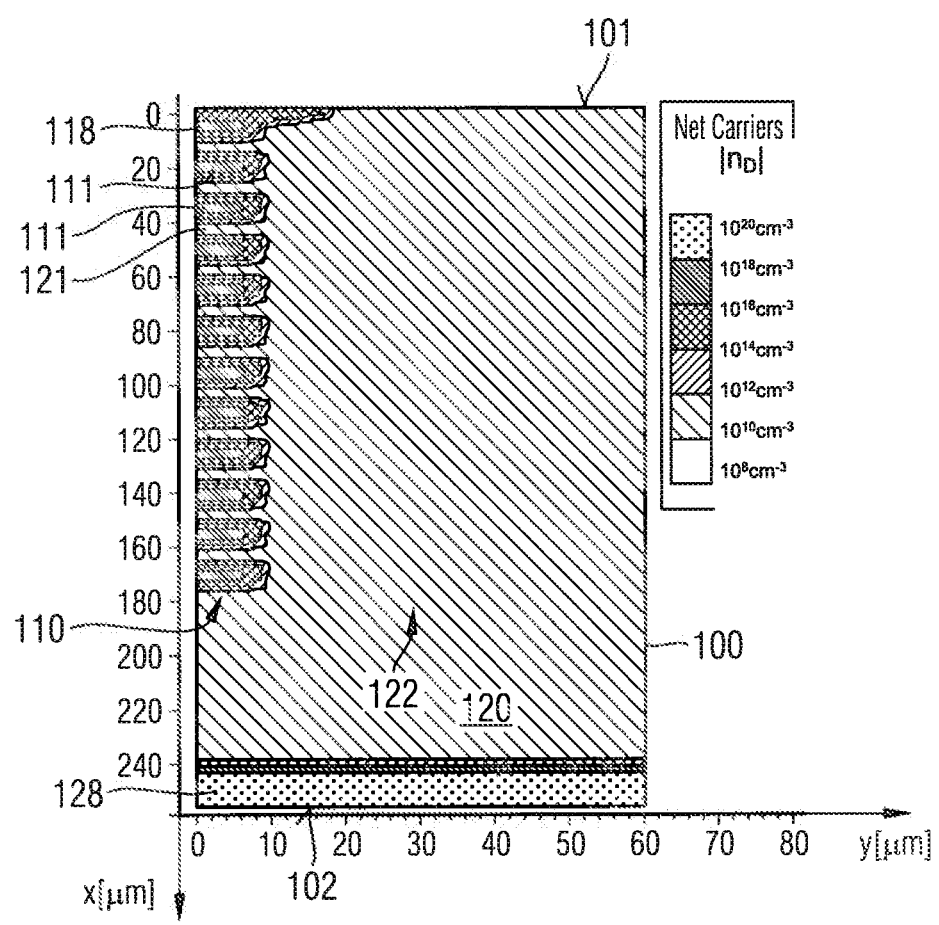
FIG. 2B is a schematic diagram showing the charge carrier distribution in the radiation conversion device of FIG. 2A with no voltage applied between the electrodes.
Figure 2C:
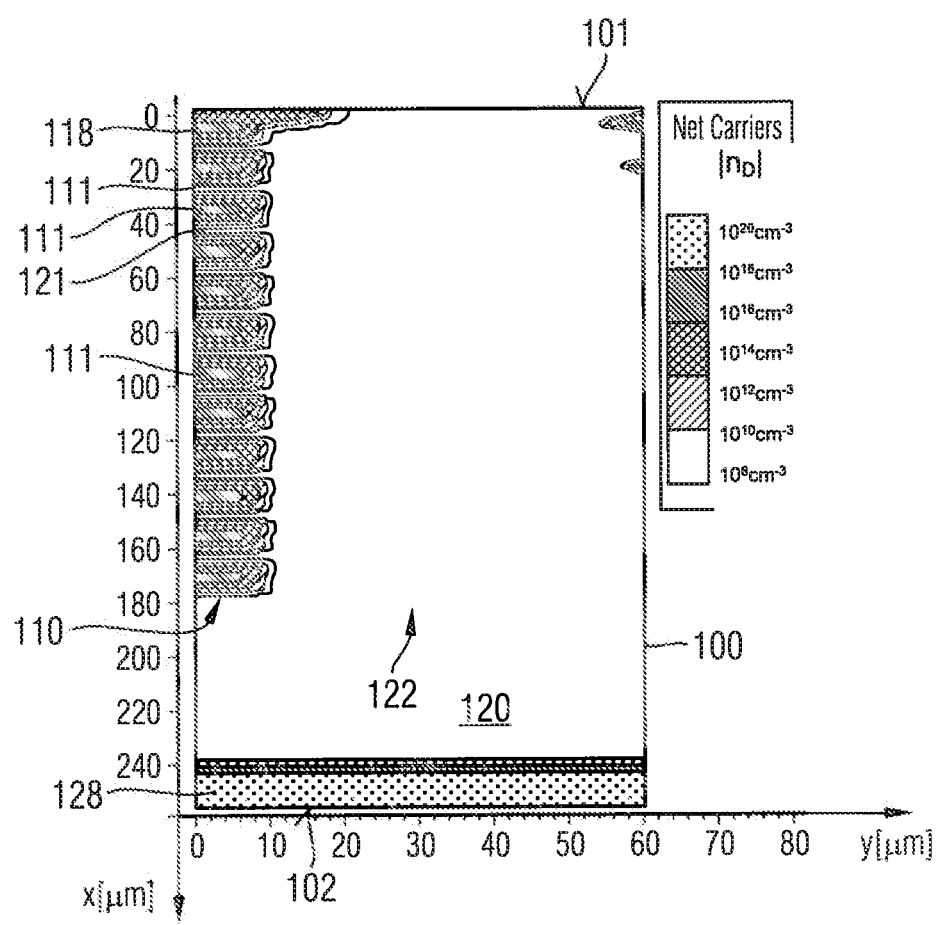
FIG. 2C is a schematic diagram showing the charge carrier distribution in the radiation conversion device of FIG. 2A in the reverse biased mode.

FIG. 2B shows the charge carrier distribution $n_D$ in the radiation detection device 910 of FIG. 2A in the idle state without a reverse voltage applied. FIG. 2C shows the charge carrier distribution $n_D$ with a sufficiently high reverse voltage applied between the first and second electrode structures 210, 220. Despite the fact that the first compensation zones 111 are not connected to each other, the base portion 120 is completely depleted between the first compensation zones 111 and a predominant portion of the semiconductor portion 100 is effective for converting incoming radiation into electrical current.

Other than in super junction IGFET (insulated gate field effect transistor) devices radiation conversion devices are not operated in the forward or on-state mode such that the fact that the first compensation zones 111 at least partially float do not affect adversely the performance of the device.

The first compensation zones 111 may be provided by repeating a sequence including (i) growing semiconductor layers by epitaxy and (ii) implanting impurities in vertically aligned surface sections of the grown semiconductor layers, as well as a final anneal to control the diffusion of the implanted impurities. Where structurally connected first compensation zones 111 require a sufficiently high number of epitaxial layers and/or a sufficiently long anneal to ensure that the first compensation zones 111 get connected, the embodiments relying on not-connected first compensation zones 111 get by with a lower number of epitaxial layers and/or a reduced anneal time such that the manufacture of the radiation conversion device 910 is simplified and less cost effective.

Figure 2D:
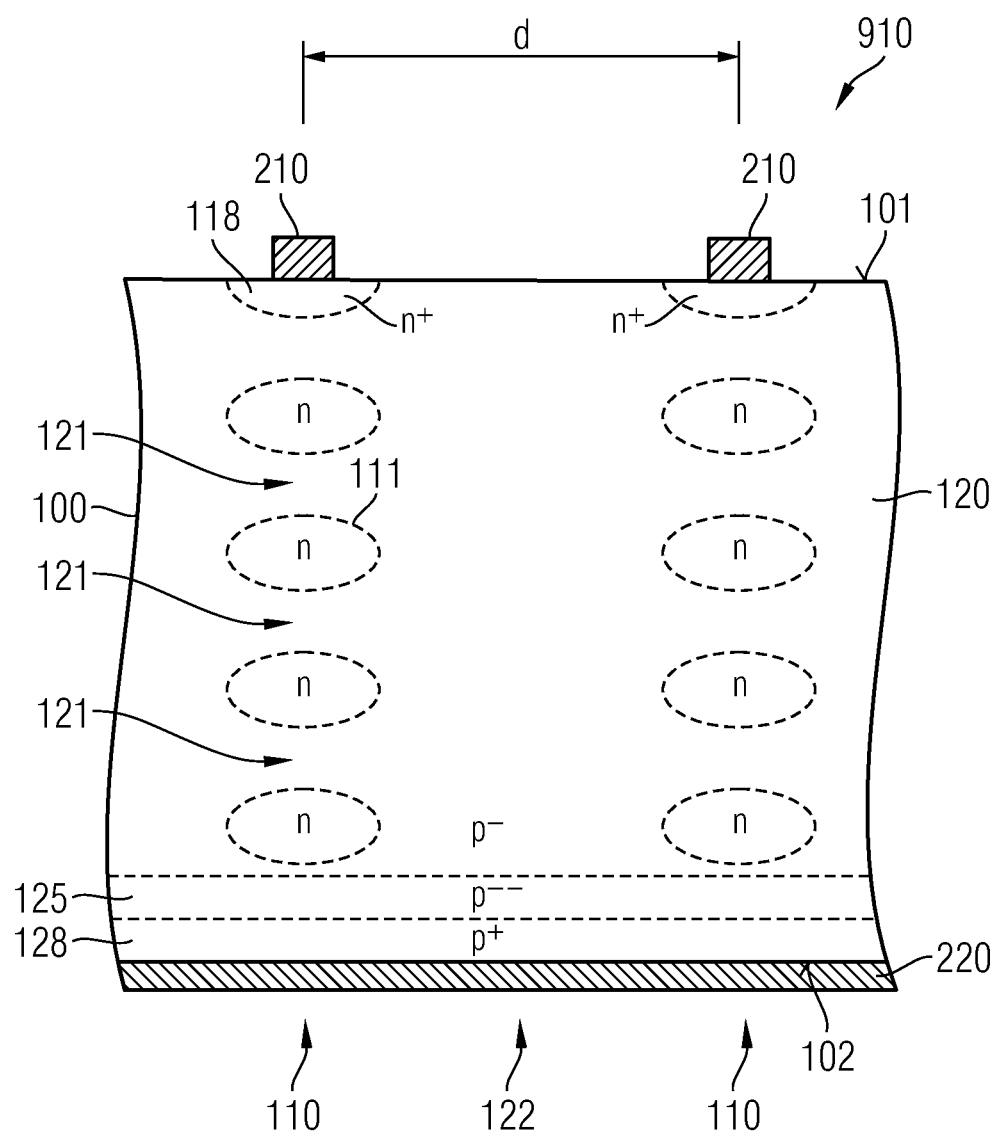
FIG. 2D is a schematic cross-sectional view of a portion of a radiation conversion device in accordance with an embodiment providing a uniformly p-doped base portion.

The radiation conversion device 910 of FIG. 2D corresponds to the radiation conversion device of FIG. 2A with the first impurity type being n-type and the second impurity type being p-type. In addition the base zone 120 may include a p type buffer layer 125 for accommodating an applied voltage. An impurity concentration in the buffer layer 125 may be lower than in portions of the base portion 120 outside the buffer layer 125. The buffer layer 125 may be grown by epitaxy and in-situ doped during the growth. Since radiation damages gradually increase the acceptor concentration, the embodiment excludes a change of the conductivity type in low-doped sections of the base portion 120 within the operation life span.

Figure 3A:
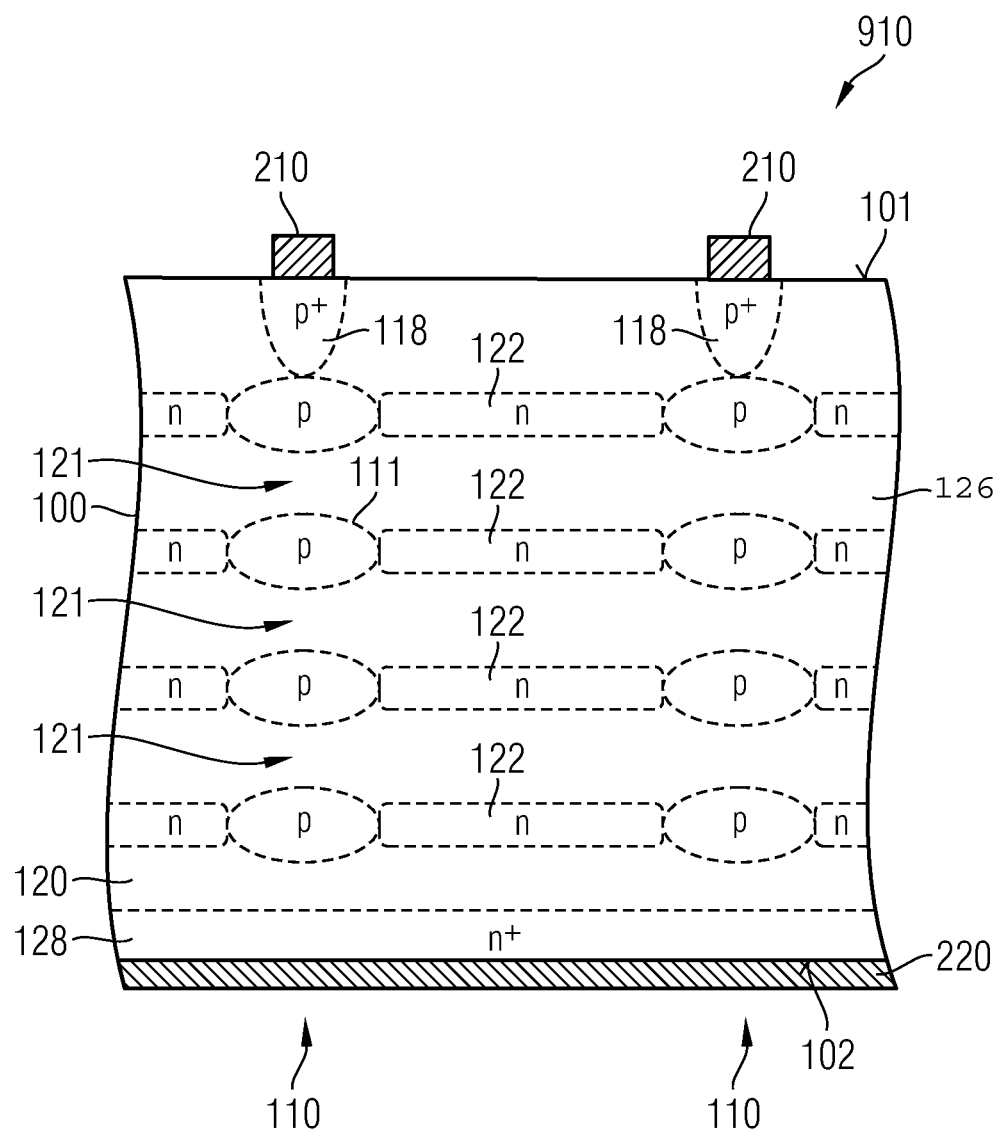
FIG. 3A is a schematic cross-sectional view of a portion of a radiation conversion device in accordance with an embodiment providing implanted first and second compensation zones.
Figure 3B:
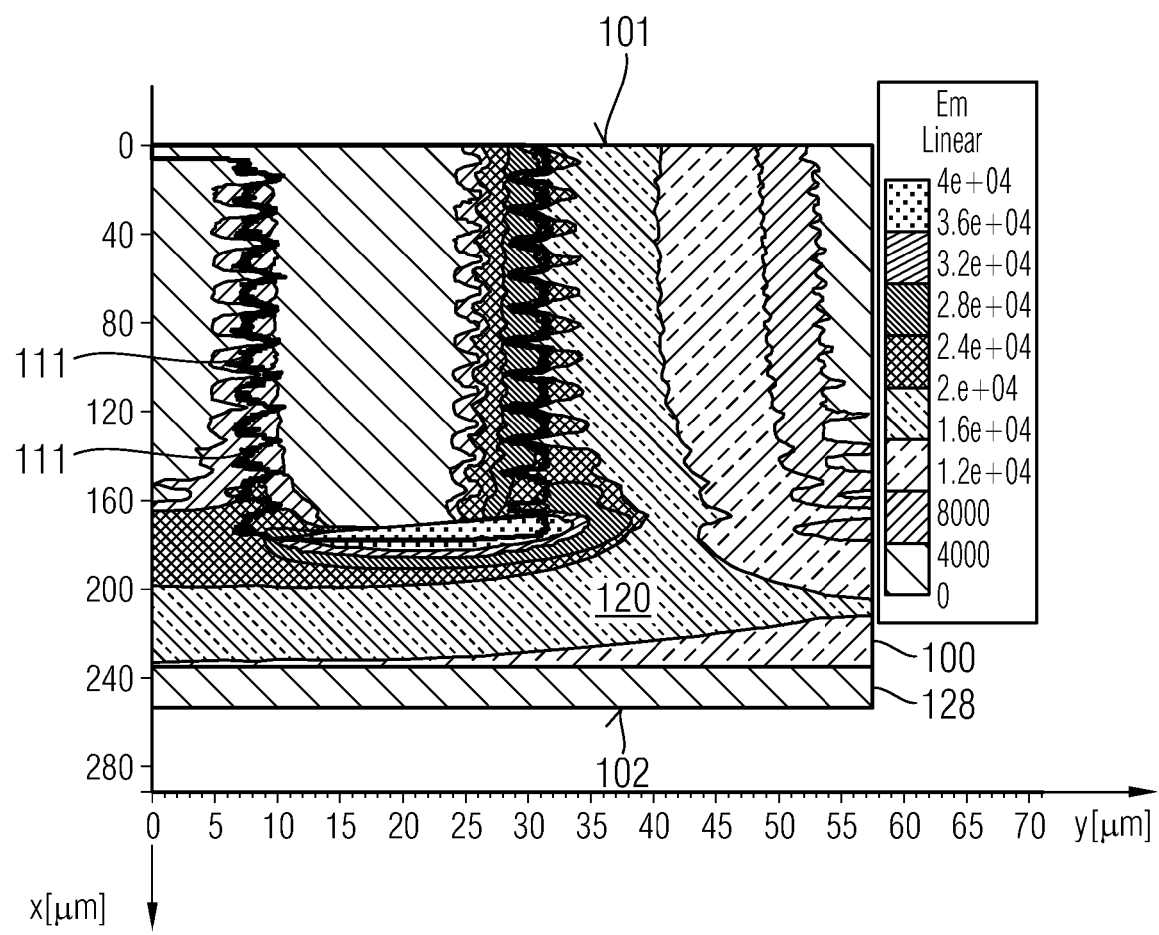
FIG. 3B is a schematic diagram showing electric field profiles in the radiation conversion device of FIG. 3A with no voltage applied between the electrodes.

The radiation conversion device 910 of FIGS. 3A to 3C differs from the radiation conversion device 910 of FIG. 2A in that the first contact zones 118 directly adjoin the first conversion zones 111 closest to the main surface 101. In addition the second compensation zones 122 at least partially emerge from introducing impurities of the second conductivity type in the surface of epitaxial semiconductor layers e.g. by masked or unmasked implants. Vertical impurity profiles of the second compensation zones 122 approximate the Gaussian distribution. Providing a significant portion, for example at least 50% or more than 90%, of the impurities of the second compensation zones 122 by an implant process instead of by in-situ doping during the epitaxial growth may increase the precision of the compensation.

If in the course of operation the radiation gradually generates more acceptor atoms and shifts the dopant level in a lightly doped background section 126 of the base portion 120 outside the second compensation zones 122 from n type to p type, the more heavily doped n-doped second compensation zones 122 still ensure the complete depletion of sections of the base portion 120 between neighboring pillar structures 110.

FIG. 3B shows the electric field for the radiation conversion device 910 of FIG. 3A before aging and FIG. 3C the electric field for the same device 910 after a simulated aging, wherein the area concentration of p-type impurities after aging is assumed to be $2 \times 10^{13}$ cm$^{-2}$, which is assumed to be significantly higher than p-type area concentrations achieved by regular aging processes.

In addition, the aging results in an electric field gradient that is more favorable in some respects. For example, a maximum field strength occurring at the edge of the pillar structures 110 is reduced. The effect may improve the radiation hardness of a termination structure in an edge portion of the radiation conversion device 910. In case of a p-type base epitaxy aging may result in an even more favorable electric field gradient since the electric field strength gradually decreases along the interfaces of the pillar structures 110 in the base zone 120 and the maximum electric field increasingly appears in a lateral layer section of the base zone 120 parallel and next to the second contact zones 128.

According to an embodiment, the n-type first compensation zones 111 may be provided from fast diffusing donator type impurities, for example sulfur S or selenium Se such that the temperature/time budget of the diffusion process can be significantly reduced. In addition donator materials like sulfur S and selenium Se, which provide an energy level deep in the energy gap of silicon Si, increase the diffusion length in the detector volume as a result of the effectively reduced free charge carrier concentration.

Figure 4A:
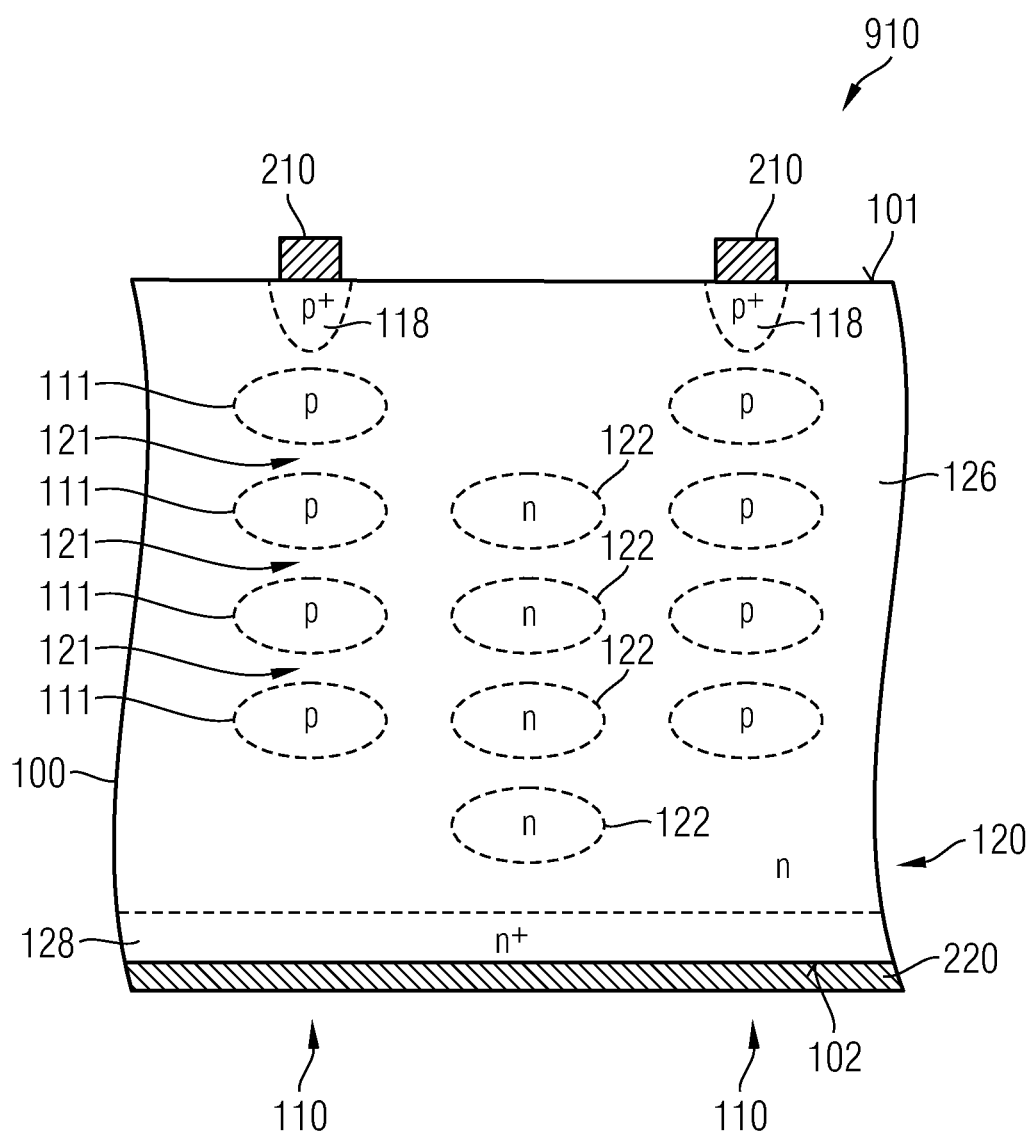
FIG. 4A is a schematic cross-sectional view of a portion of a radiation conversion device in accordance with an embodiment providing spatially separated implanted compensation zones of both impurity types.

In FIG. 4A, the base zone 120 of the radiation conversion device 910 includes second compensation zones 122 with the vertical impurity profiles being approximately Gaussian distributions. Two or more second compensation zones 122 are aligned along the vertical direction and form further pillar structures which are spaced from the pillar structures 110. A uniformly doped background section 126 of the base portion 120 may separate the pillar structures 110 with the first compensation zones 111 and the further pillar structures with the second compensation zones 122. The pillar structures 110 may be connected to first contact zones 118 and the further pillar structures may be connected to one or more second contact zones 128.

The net dopant concentration in the second compensation zones 122 may in substance correspond to the impurity concentration in the corresponding first compensation zones 111. The remaining background portion 126 may be intrinsic, n-type or p-type. The base portion 120 can be completely depleted even at comparatively high impurity concentrations in the compensation zones 111, 122.

The first compensation zones 111 of each pillar structure 110 may be separated by the uniformly doped background section 126 of the base portion 120, and the second compensation zones 122 of each further pillar structure may be separated by the uniformly doped background section 126.

According to the embodiment of FIG. 4B, the first compensation zones 111 of each pillar structure 110 are structurally connected to each other or overlap with each other and the second compensation zones 122 of each further pillar structure are structurally connected to each other or overlap with each other.

Figure 4C:
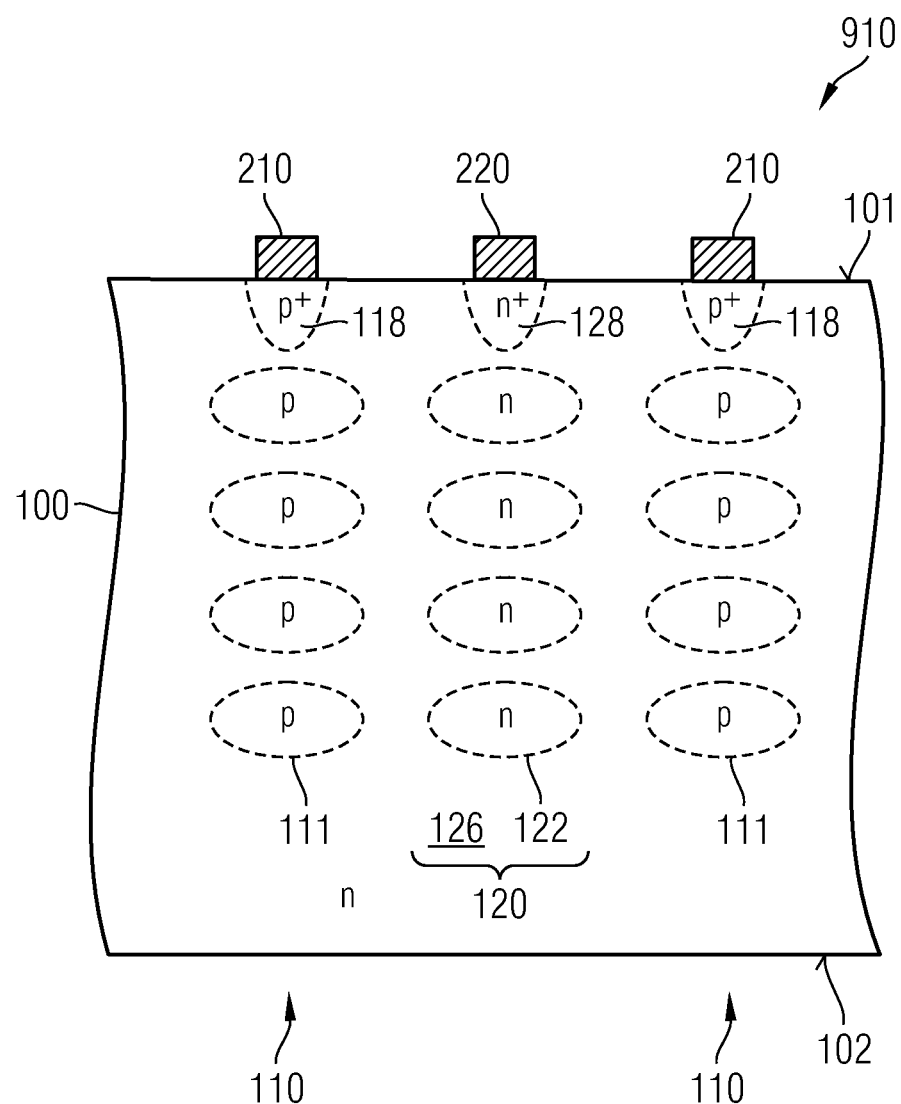
FIG. 4C is a schematic cross-sectional view of a portion of a radiation conversion device in accordance with an embodiment providing p and n electrodes at the same side.

FIG. 4C refers to a radiation conversion device 910 providing both the first and the second electrodes 210, 220 at the main surface 101. Non-transparent electrode materials may be used for both the first and second electrodes 210, 220 with the rear side surface 102 forming the radiation-receiving surface through which the radiation enters the semiconductor portion 100.

Figure 5A:
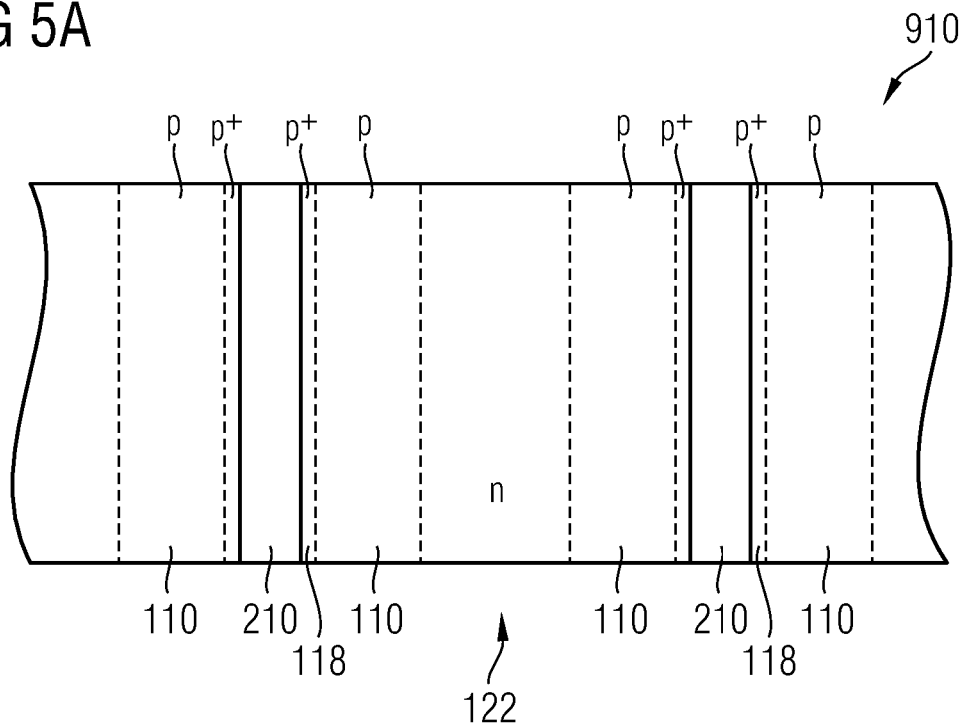
FIG. 5A is a schematic top view of a portion of a radiation conversion device in accordance with an embodiment providing an electrode with a single strip assigned to two pillar structures.
Figure 5B:
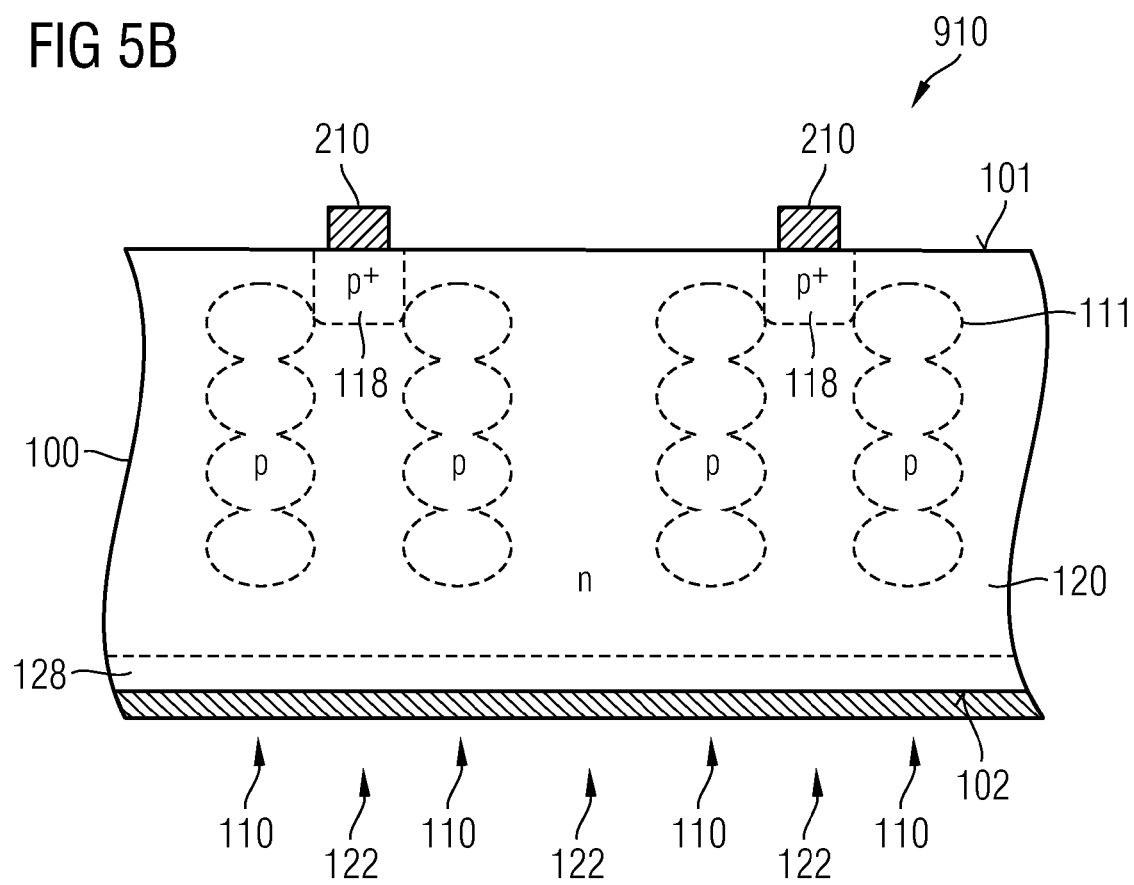
FIG. 5B is a schematic cross-sectional view of the radiation conversion device of FIG. 5A.

FIGS. 5A and 5B refer to a radiation conversion device 910 with a semiconductor portion 100 including first compensation zones 111 of a first conductivity type arranged in stripe-shaped pillar structures 110. The first compensation zones 111 of each pillar structure 110 may be connected to each other or may be separated from each other. Between neighboring pillar structures 110 second compensation zones 122 of a second, complementary conductivity type may form further pillar structures. Each pillar structure 110 extends in a vertical direction and in a first lateral direction with respect to a main surface 101 of the semiconductor portion 100. A first electrode structure 210 directly adjoins the semiconductor portion 100 at the main surface 101 and includes a plurality of strips. Each strip is assigned to at least two pillar structures 110. According to the illustrated embodiment, the strips directly adjoin first contact zones 118, wherein each of the first contact zones 118 is assigned to two parallel pillar structures 110.

Figure 6:
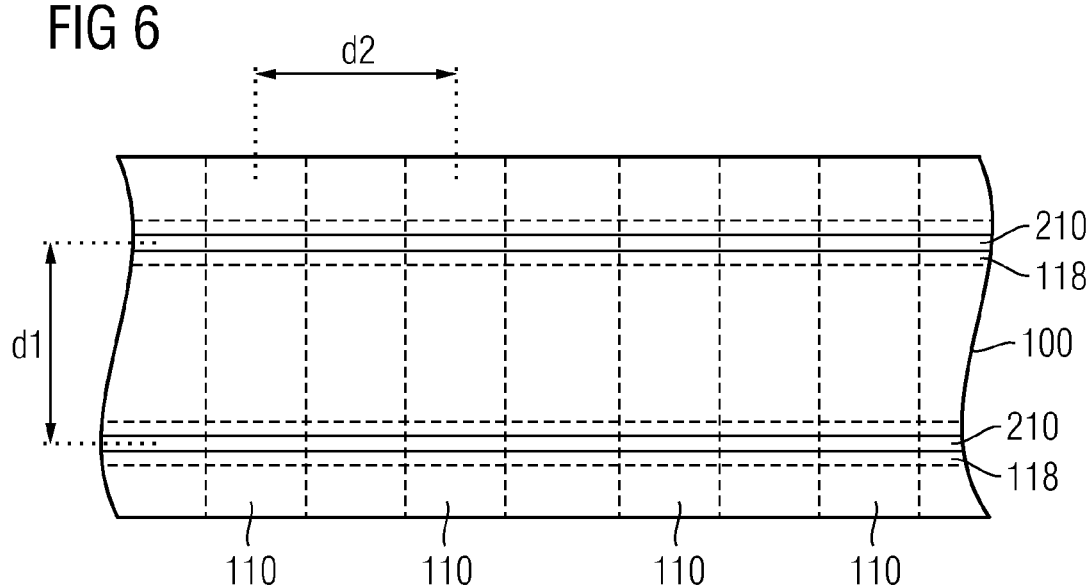
FIG. 6 is a schematic top view of a portion of a radiation conversion device in accordance with an embodiment providing an electrode with strips crossing stripe-shaped pillar structures.

According to the embodiment shown in FIG. 6 the strips of the first electrode 210 run in a second lateral direction orthogonally intersecting the first lateral direction defined by the stripe-shaped pillar structures 110. Heavily doped first contact zones 118 run parallel to the strips to provide a Schottky contact between the first electrode structure 210 and the pillar structures 110.

A first pitch d1 of the strips of the first electrodes 210 is decoupled from a second pitch d2 of the pillar structures 110. According to an embodiment, the second pitch d2 of the pillar structures 110 is significantly smaller than, for example at most half, the first pitch d1 to achieve both a high dopant level in the detector area and a great pitch for the strips of the first electrode structure 210 simplifying and making more reliable the manufacture of the radiation conversion device 910.

Figure 7A:
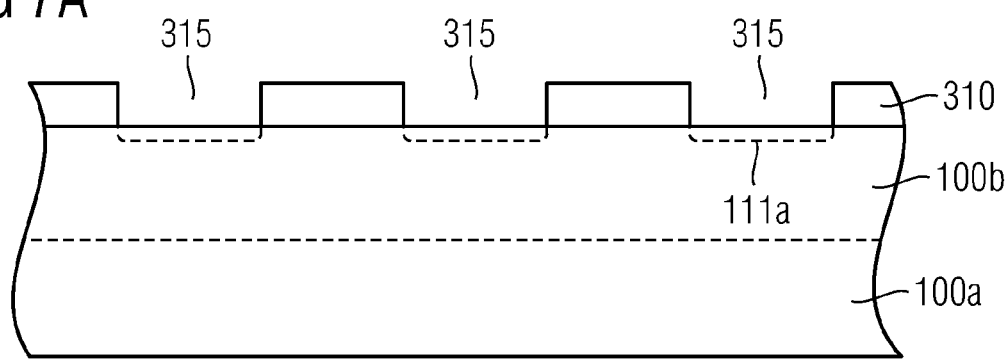
FIG. 7A is a schematic cross-sectional view of a semiconductor substrate for illustrating a method of manufacturing a radiation conversion device according to an embodiment after introducing impurities in sections of a first semiconductor layer grown by epitaxy.
Figure 7B:
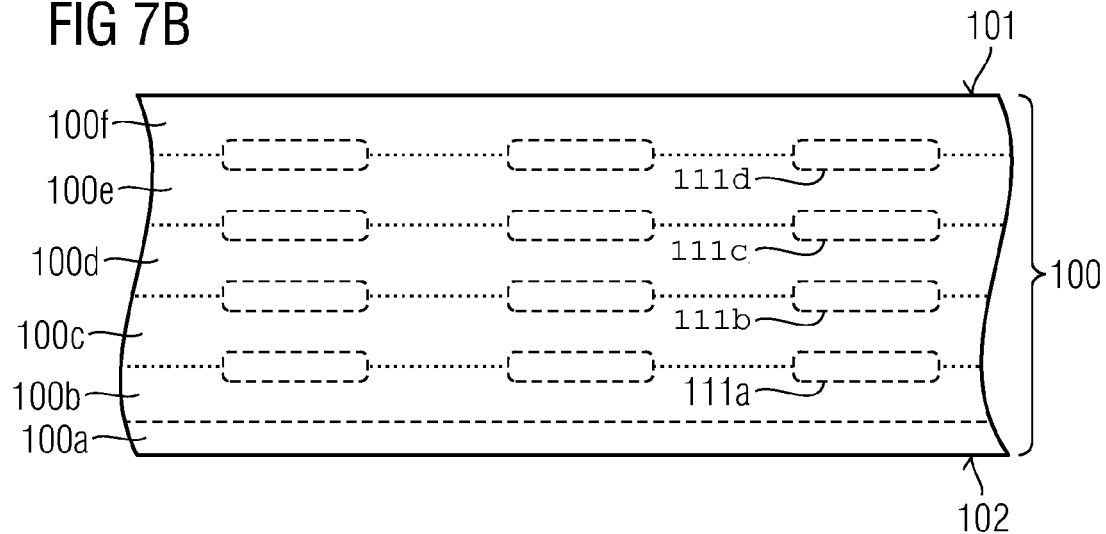
FIG. 7B is a schematic cross-sectional view of the semiconductor substrate of FIG. 7A after growing a sequence of semiconductor layers.

FIGS. 7A to 7C refer to the manufacture of a radiation conversion device. On a semiconductor base substrate 100a a semiconductor layer 100b is grown by epitaxy. The crystal lattice of the grown semiconductor layer 100b grows in registry with the crystal lattice in the base substrate 100a. A mask layer is deposited on the grown semiconductor layer 100b and patterned by a photolithographic process to obtain an impurity mask 310 with openings 315. The grown semiconductor layer 100b may be an intrinsic layer, lightly p-doped or lightly n-doped. Impurities of a first conductivity type, for example p-type, are introduced through the openings 315 in the impurity mask 310 into exposed first surface sections of the grown semiconductor layer 100b to form implant zones 111a. The implant energy may be selected such that the impurities are implanted in close proximity to the exposed surface of the grown semiconductor layer 100b.

FIG. 7A shows the implanted zones 111a close to the exposed surface of the grown semiconductor layer 100b in first sections exposed by the implant mask 310. The implant mask 310 is removed and a cycle including (i) growing by epitaxy a semiconductor layer (ii) providing an implant mask with openings aligned to the openings in the first implant mask 310 (iii) implanting impurities of the first conductivity type and (iv) removing the implant mask is repeated several times.

FIG. 7B shows a semiconductor portion 100 obtained by growing successively five semiconductor layers 100b-100f by epitaxy on the base substrate 100a. In the first to fourth semiconductor layers 100b to 100e, implanted zones 111a-111d are aligned along the vertical direction orthogonal to a main surface 101 of the obtained semiconductor portion 100. An anneal is performed such that the impurities of the implanted zones 111a to 111d diffuse out to form first compensation zones 111 arranged in pillar structures 110. The annealing is terminated before the first compensation zones 111 overlap each other. Then first contact zones 118 of the first conductivity type are formed that directly adjoin the main surface 101. Second contact zones 128 of the second conductivity type may be provided at the rear side surface 102. Electrode structures 210, 220 are provided that form Schottky contacts with the first and second contact zones 118, 128.

FIG. 7C shows the resulting radiation conversion device 910 similar to the radiation conversion device of FIG. 2A. According to an other embodiment, each cycle may include an unmasked implant of impurities of the second conductivity type before or after the masked implant of impurities of the first conductivity type to obtain the radiation conversion device of FIG. 3A.

Figure 8A:
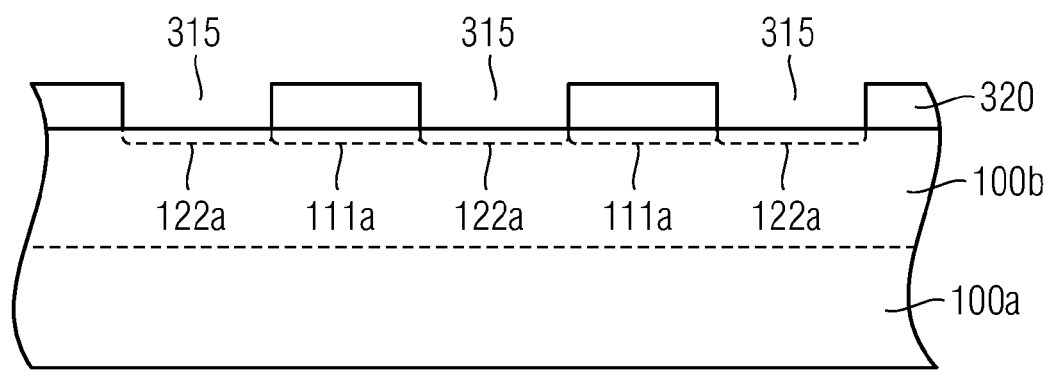
FIG. 8A is a schematic cross-sectional view of a semiconductor substrate for illustrating a method of manufacturing a radiation conversion device according to another embodiment after introducing impurities of both types in sections of a first semiconductor layer grown by epitaxy.
Figure 8B:
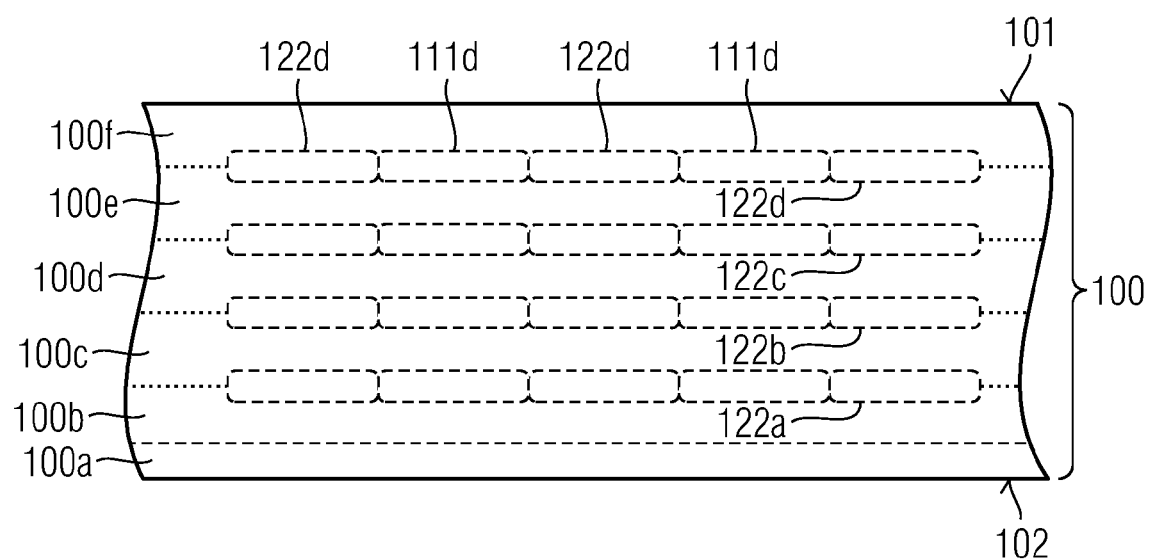
FIG. 8B is a schematic cross-sectional view of the semiconductor substrate of FIG. 8A after growing a sequence of semiconductor layers.
Figure 8C:
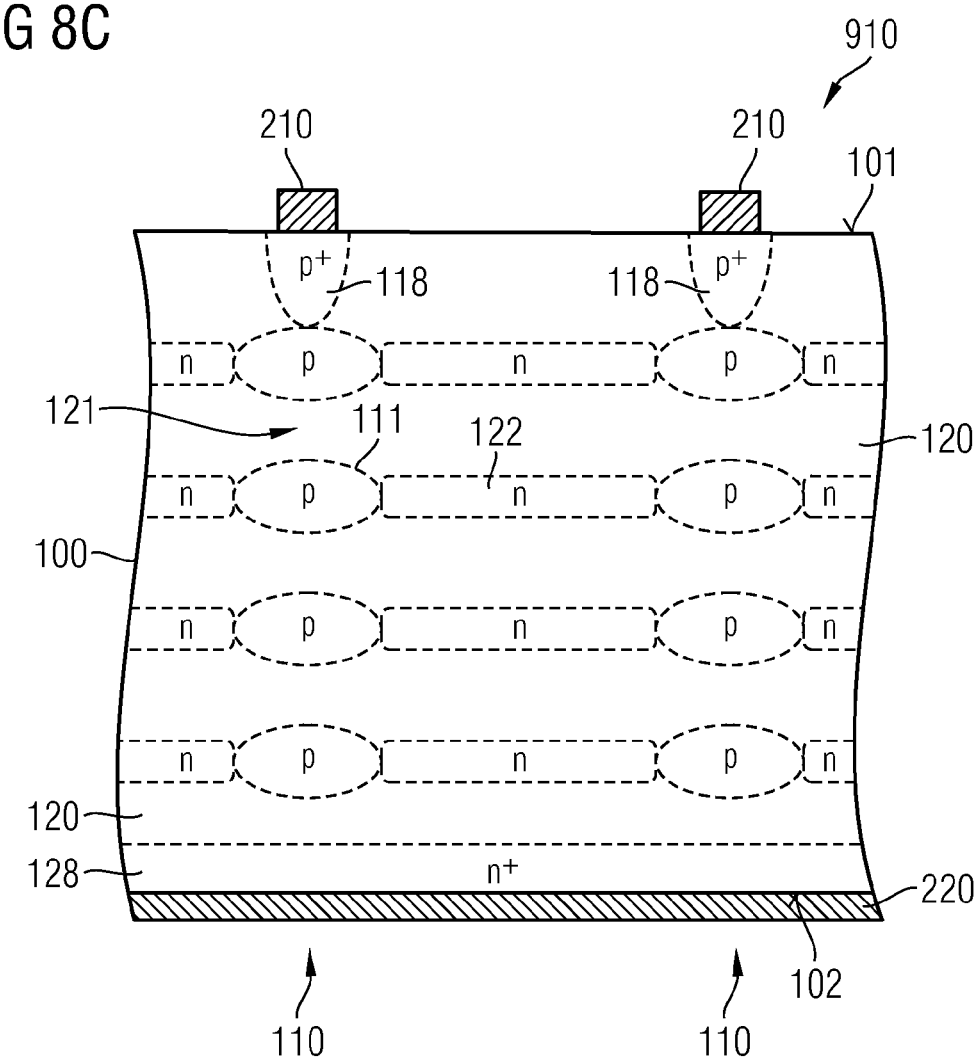
FIG. 8C is a schematic cross-sectional view of the semiconductor substrate of FIG. 8B after annealing.

FIGS. 8A to 8C refer to a further method providing a second implant mask 320 covering the implanted zones 111a of FIG. 7A. In each cycle impurities of a second conductivity type, which is complementary to the first conductivity type, are implanted into the epitaxial semiconductor layer 100b to form further implanted zones 122a of the second conductivity type in some or each of the epitaxial semiconductor layers 100b-100f. The sequence of the implants of the first and second conductivity type may be inverted for each semiconductor layer 100b-100f.

Figure 9:
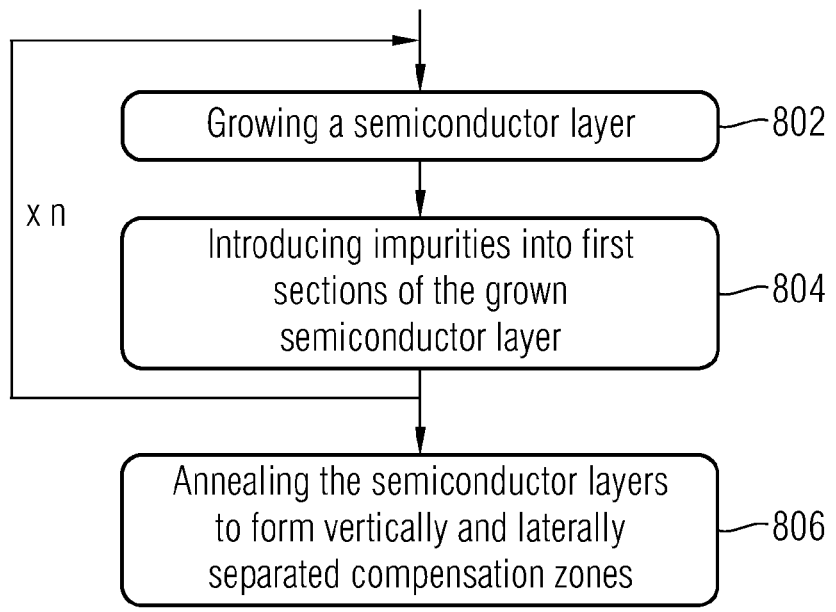
FIG. 9 is a schematic flow chart of a method of manufacturing a radiation conversion device in accordance with a further embodiment.

According to FIG. 9 a method of manufacturing a radiation conversion device includes growing by epitaxy a sequence of semiconductor layers on a semiconductor substrate (802), wherein impurities of a first conductivity type are introduced into first sections of an exposed surface of each of the grown semiconductor layers before growing a subsequent one of the semiconductor layers (804). The grown semiconductor layers are annealed to form first compensation zones from the introduced impurities (806). The first compensation zones remain separated by a base portion, wherein second compensation zones of a complementary second conductivity type separate the first compensations zones in a lateral direction and further sections of the base portion separate the first compensations zones in a vertical direction.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A radiation conversion device, comprising:
    a semiconductor portion provided from a single-crystalline semiconductor material and comprising first compensation zones of a first conductivity type and a base portion separating the first compensation zones from each other,
    the first compensation zones arranged in pillar structures, each pillar structure comprising at least two of the first compensation zones and extending in a vertical direction with respect to a main surface of the semiconductor portion, and
    the base portion comprising second compensation zones of a second, complementary conductivity type between neighboring ones of the pillar structures,
    wherein the pillar structures are stripe-shaped and extend in a first lateral direction with respect to the main surface.

2. The radiation conversion device according to claim 1, wherein sections of the base portion separating the first compensation zones in the vertical direction have a uniform impurity distribution.

3. The radiation conversion device according to claim 1, wherein sections of the base portion separating the first compensation zones in the vertical direction have a mean net impurity concentration of at most one twentieth of a mean net impurity concentration in the first compensation zones.

4. The radiation conversion device according to claim 1, wherein sections of the base portion separating the first compensation zones in the vertical direction have the second conductivity type.

5. The radiation conversion device according to claim 1, wherein the second compensation zones and sections separating the first compensation zones in the vertical direction have a uniform impurity distribution, and impurity profiles of the first compensation zones along the vertical direction are approximately Gaussian distributions.

6. The radiation conversion device according to claim 1, further comprising:
    a first electrode structure arranged in direct contact with the main surface.

7. The radiation conversion device according to claim 6, wherein the first electrode structure comprises a plurality of strips running in a second lateral direction intersecting the first lateral direction.

8. The radiation conversion device according to claim 6, wherein the first electrode structure comprises a plurality of strips running parallel to the first lateral direction.

9. The radiation conversion device according to claim 8, wherein each of the strips is assigned to at least two of the pillar structures.

10. The radiation conversion device according to claim 6, wherein the semiconductor portion comprises a first contact region of the first conductivity type, the first contact region heaving a mean net impurity concentration providing an ohmic contact to the first electrode structure, the first contact region directly adjoining one of the first compensation zones of the assigned pillar structures and the first electrode structure.

11. The radiation conversion device according to claim 1, wherein the semiconductor portion comprises a second contact region of the second conductivity type, the second contact region having a mean net impurity concentration for providing an ohmic contact to a second electrode structure, the second contact region directly adjoining the base portion and the second electrode structure.

12. The radiation conversion device according to claim 11, wherein the second contact region directly adjoins the main surface.

13. The radiation conversion device according to claim 11, wherein the second contact region directly adjoins a surface of the semiconductor portion opposing the main surface.

14. A radiation conversion device, comprising:
    a semiconductor portion comprising first compensation zones of a first conductivity type arranged in stripe-shaped pillar structures and second compensation zones of a second, complementary conductivity type between neighboring ones of the stripe-shaped pillar structures, each stripe-shaped pillar structure comprising at least two of the first compensation zones and extending in a vertical direction and in a first lateral direction with respect to a main surface of the semiconductor portion; and
    a first electrode structure comprising a plurality of strips directly adjoining the semiconductor portion, each strip being assigned to at least two of the stripe-shaped pillar structures.

15. The radiation conversion device according to claim 14, wherein the strips run in a second lateral direction intersecting the first lateral direction.

16. The radiation conversion device according to claim 14, wherein the strips run parallel to the first lateral direction and each strip runs between two neighboring ones of the pillar structures.

17. A radiation conversion device, comprising:
    a semiconductor portion including first compensation zones of a first conductivity type and a base portion,
    the first compensation zones arranged in pillar structures, wherein each pillar structure extends in a vertical direction with respect to a main surface of the semiconductor portion, and the base portion comprising a background portion and second compensation zones of a second, complementary conductivity type between neighboring ones of the pillar structures, the second compensation zones forming further pillar structures extending in the vertical direction and vertical impurity profiles of the second compensation zones being Gaussian distributions.

18. The radiation conversion device according to claim 17, wherein each of the pillar structures comprises at least two spatially separated first compensation zones.

19. A method of manufacturing a radiation conversion device, the method comprising:
    growing by epitaxy a sequence of semiconductor layers on a semiconductor substrate;
    introducing, in at least two of the semiconductor layers, impurities of a first conductivity type into exposed first sections of a process surface of a preceding one of the semiconductor layers before growing a subsequent one of the semiconductor layers on the preceding one; and
    annealing the grown semiconductor layers to form first compensation zones from the introduced impurities, wherein the annealing is terminated before the first compensation zones get structurally connected.

20. A radiation conversion device, comprising:
    a semiconductor portion provided from a single-crystalline semiconductor material and comprising first compensation zones of a first conductivity type and a base portion separating the first compensation zones from each other,
    the first compensation zones arranged in pillar structures, each pillar structure comprising at least two of the first compensation zones and extending in a vertical direction with respect to a main surface of the semiconductor portion, and
    the base portion comprising second compensation zones of a second, complementary conductivity type between neighboring ones of the pillar structures,
    wherein impurity profiles of the second compensation zones along the vertical direction are approximately Gaussian distributions.

21. The radiation conversion device according to claim 20, wherein sections of the base portion separating the second compensation zones in the vertical direction have the first conductivity type.

* * * * *